United States Patent
King

(10) Patent No.: US 6,261,926 B1
(45) Date of Patent: Jul. 17, 2001

(54) METHOD FOR FABRICATING FIELD OXIDE

(75) Inventor: Wei-Shang King, Taoyuan Hsien (TW)

(73) Assignee: Mosel Vitelic, Inc., Hsinchu (TW)

( * ) Notice: Subject to any disclaimer, the term of this patent is extended or adjusted under 35 U.S.C. 154(b) by 0 days.

(21) Appl. No.: 09/569,246

(22) Filed: May 11, 2000

(51) Int. Cl.$^7$ .................................................. H01L 21/76
(52) U.S. Cl. ........................ 438/439; 438/225; 438/452
(58) Field of Search ................................... 438/225, 362, 438/426, 439, 443, 452

(56) References Cited

U.S. PATENT DOCUMENTS

| | | | | |
|---|---|---|---|---|
| 5,696,002 | * | 12/1997 | Jang | 438/443 |
| 5,726,093 | * | 3/1998 | Yoo | 438/452 |
| 5,789,305 | * | 8/1998 | Peidous | 438/439 |
| 5,858,857 | * | 1/1999 | Ho | 438/426 |
| 6,033,969 | * | 3/2000 | Yoo et al. | 438/426 |
| 6,093,622 | * | 7/1998 | Ahn et al. | 438/426 |
| 6,114,194 | * | 9/2000 | Hsu | 438/225 |

* cited by examiner

Primary Examiner—Charles Bowers
Assistant Examiner—David S Blum
(74) Attorney, Agent, or Firm—Chien-Wei (Chris) Chou; Oppenheimer Wolff & Donnelly LLP

(57) ABSTRACT

The present invention provides a method for fabricating a field oxide on a semiconductor substrate. A first pad layer and a first mask layer is formed successively on the semiconductor substrate. An opening is formed in the first mask layer to define a region for forming the field oxide. A first field oxide is formed in the opening, which is then removed to form a concave portion. The first pad layer exposed by the concave portion is removed to form a cavity. A second pad layer having a smaller thickness than the first pad layer is formed on the semiconductor substrate. A mask portion is formed in the sidewall of the patterned first mask layer and the cavity. The mask portion in the sidewall of the patterned first mask layer has a thickness less than 300 Å. Finally, thermal oxidation is carried out to form a second field oxide in the concave portion. By means of the local pad film thinning technique, and forming a nitride liner and a concave portion to grow the field oxide layer, the bird's beak encroachment and the thinning effect of the field oxide layer can be both inhibited. In addition, defects in the silicon substrate due to the formation of the field oxide can also be inhibited.

17 Claims, 7 Drawing Sheets

METHOD FOR FABRICATING FIELD OXIDE

BACKGROUND OF THE INVENTION

1. Field of the Invention

The present invention relates to a method for fabricating a field oxide, and more particularly to a method for fabricating a field oxide by means of a local pad film thinning technique, and forming a nitride liner and a concave portion on a semiconductor substrate, which can inhibit the bird's beak encroachment, the thinning effect of the field oxide layer, and defects in the substrate due to the formation of the field oxide.

2. Description of the Prior Art

Due to the improvement of the techniques for the production of integrated circuits in recent years, the numbers of semiconductor devices contained in a chip has increased, and the minimum dimension of a device has become finer for higher integration. For example, the line width of a semiconductor device (i.e., a transistor) used nowadays has become submicron. However, no matter how much the device dimension is decreased, it is still required that the semiconductor devices in a chip be isolated from each other to obtain good properties. The main purpose of such a device isolation technology is to form isolation region between devices. It is necessary to reduce the width of the isolation region as much as possible in order to spare more chip surface to accommodate a greater amount of devices.

The local oxidation of silicon (LOCOS) process is a well-known device isolation technology, which involves forming a thick oxide layer as the insulating layer to effectively isolate the devices from each other. The process will be described below in more detail. Referring to FIG. 1A, a pad oxide layer 11 and a silicon nitride layer 12 are successively formed on a semiconductor substrate 10, such as a silicon wafer, as a mask layer 19. Then, the pad oxide layer 11 and silicon nitride layer 12 are patterned by photolithography and etching to form an opening 13, such that a portion of the semiconductor substrate 10 is exposed and the exposed region is called an isolation region 17.

Subsequently, referring to FIG. 1B, the thermal oxidation process is preformed. For example, the silicon wafer 10 is placed in a furnace at a temperature of 800° C. to 1100° C. and the oxygen gas is introduced. Thus, a thick field oxide layer 14 will be formed to define an active region 18. Since the oxidation rate of the silicon nitride layer 12 is far smaller than that of the silicon wafer 10, the silicon nitride layer 12 can serve as a mask during the thermal oxidation, such that the field oxide layer is formed on the exposed region. Finally, the pad oxide layer 11 and the silicon nitride layer 12 are removed. The device isolation process is thus completed.

The LOCOS process as mentioned above has simple procedures and good isolation effect; therefore, it has been a technically prevailing process. However, problems arise when the device dimension becomes finer, particularly in the submicron dimension. When silicon wafer is subjected to thermal oxidation, the oxidation not only occurs on the exposed region but also on the unexposed region. In the vicinity of the opening 13, the oxygen is diffused through the pad oxide 11 so as to form a bird's beak structure 15. This is called the bird's beak encroachment (BBE).

Many techniques have been developed to solve the BBE. For example, in U.S. Pat. No. 5,173,444, a side wall spacer made of silicon nitride serves as a mask for forming a field oxide layer. Referring to FIG. 2A, first, a pad oxide layer 2 and a silicon nitride layer 3 are successively formed on a semiconductor substrate 1, such as a silicon wafer, to serve as mask layers. Then, the pad oxide layer 2 and silicon nitride layer 3 are patterned by photolithography and etching to form an opening 5. Thus, a portion of the semiconductor substrate 1 is exposed, and the exposed region is ready for forming the isolation layer. Then, the opening 5 is subjected to thermal oxidation to form a second silicon oxide layer 4, which is thinner than the pad oxide layer 2.

Subsequently, referring to FIG. 2B, a second silicon nitride layer 7 is formed by low pressure chemical vapor deposition (LPCVD) over the whole surface, and then anisotropically etched by reactive ion etching (RIE). Then, the second silicon oxide layer 4 thus exposed is removed by the diluted hydrofluoric acid solution, leaving a residual silicon oxide layer 6 and a silicon nitride side wall spacer 7a.

Subsequently, referring to FIG. 2C, a trench 8 is formed in the opening 5 of the silicon substrate 1 by self-aligning using the silicon nitride layer 3 and the silicon nitride side wall spacer 7a as masks. Finally, a field oxide 9 is formed in the trench 8 by thermal oxidation as shown in FIG. 2D.

Since the design rule (device width) is made smaller for higher integration, it is necessary to reduce the isolation width. However, when the isolation width is made fine to a certain extent, a field oxide layer with an ideal thickness can not be obtained by using thermal oxidation, resulting in a poor isolation effect. This is called the thinning effect. In the above-mentioned U.S. Patent, since the bird's beak structure is formed on the region covered by the silicon nitride side wall spacers by means of the silicon nitride sidewall spacers, the width of the active region can meet the design rule requirements. However, the isolation width should made much finer to meet certain design rules; thus, the thinning effect becomes more obvious, resulting in poorer isolation effect.

In addition, in the above-mentioned U.S. Patent, the purpose of forming the trench 8 is to allow the field oxide formed in the subsequent procedure to have an increased depth. However, the dry etching technique used for forming the trench results in uneven corners, which in turn causes stress accumulation in the subsequently-formed field oxide. This will generate defects in the silicon substrate structure.

SUMMARY OF THE INVENTION

The object of the present invention is to solve the above-mentioned problems and to provide a method for fabricating a field oxide which can inhibit the bird's beak encroachment and the thinning effect. Defects in the silicon substrate due to the formation of the field oxide can also be inhibited.

To achieve the above-mentioned object, the method for fabricating a field oxide on a semiconductor substrate comprises the steps of:

(a) forming successively a first pad layer and a first mask layer;

(b) forming an opening in the first mask layer to define a region for forming the field oxide;

(c) forming a first field oxide in the opening;

(d) removing the first field oxide to form a concave portion;

(e) removing the first pad layer exposed by the concave portion to form a cavity;

(f) forming a second pad layer having a smaller thickness than the first pad layer on the semiconductor substrate;

(g) forming a mask portion in the sidewall of the patterned first mask layer and the cavity, wherein the mask portion in the sidewall of the patterned first mask layer has a thickness less than 300 Å; and (h) carrying out thermal oxidation to form a second field oxide in the concave portion.

BRIEF DESCRIPTION OF THE DRAWINGS

The present invention will become more fully understood from the detailed description given hereinbelow and the accompanying drawings, given by way of illustration only and thus not intended to be limitative of the present invention.

DETAILED DESCRIPTION OF THE PREFERRED EMBODIMENTS

Figure 1A:
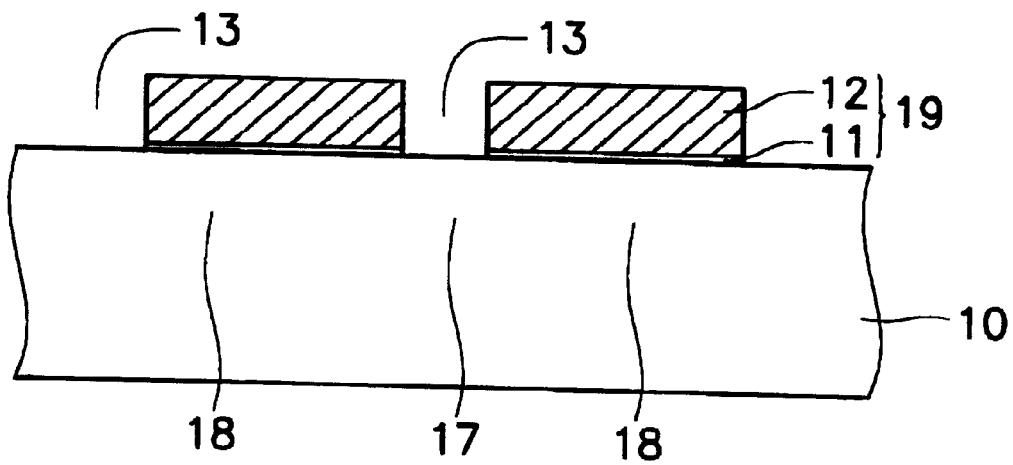
FIGS. 1A and 1B are cross-sectional views illustrating the process flow of forming the field oxide layer according to a conventional LOCOS.
Figure 1B:
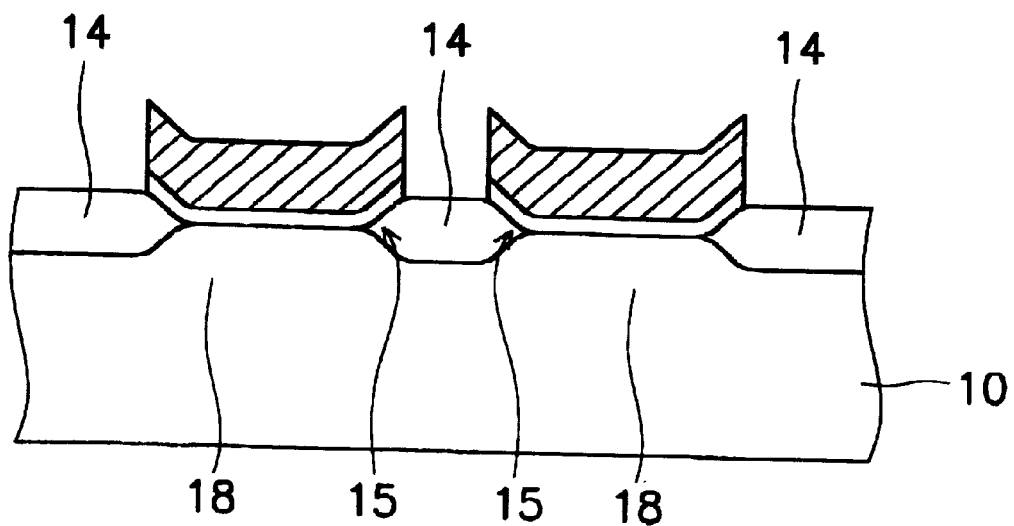
Figure 2A:
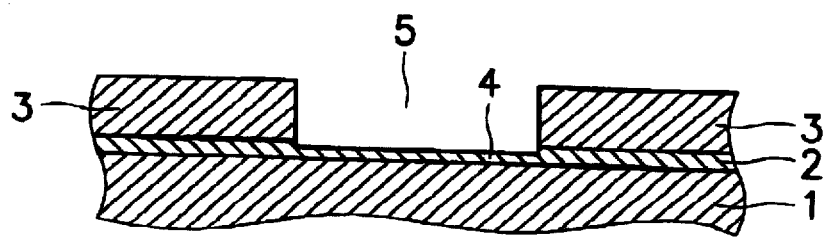
FIGS. 2A–2D are cross-sectional views illustrating the process flow of forming the field oxide layer according to another convention LOCOS, in which silicon nitride side walls are used as masks.
Figure 2B:
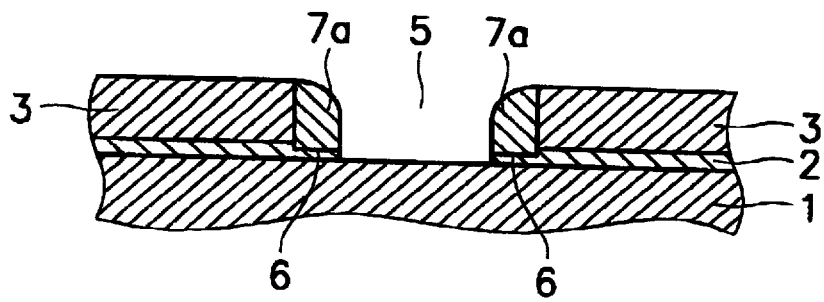
Figure 2C:
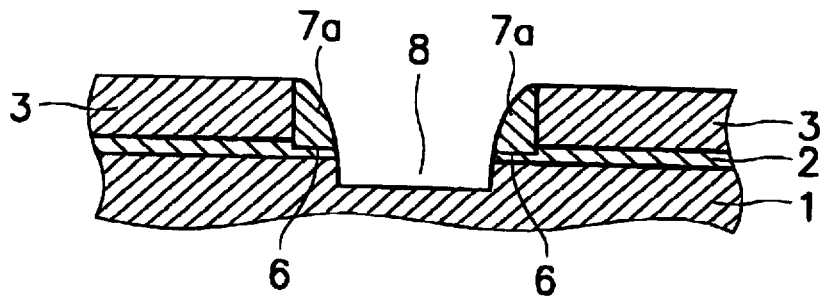
Figure 2D:
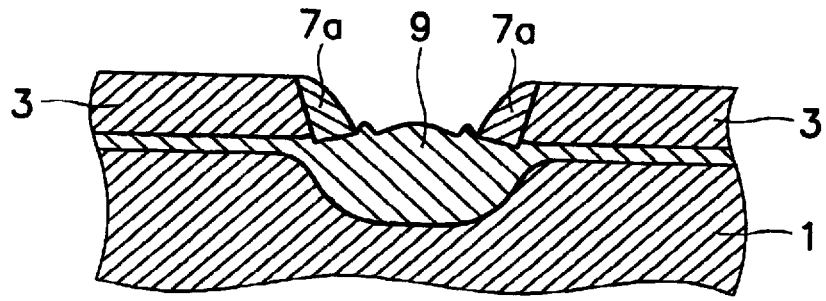
Figure 3A:
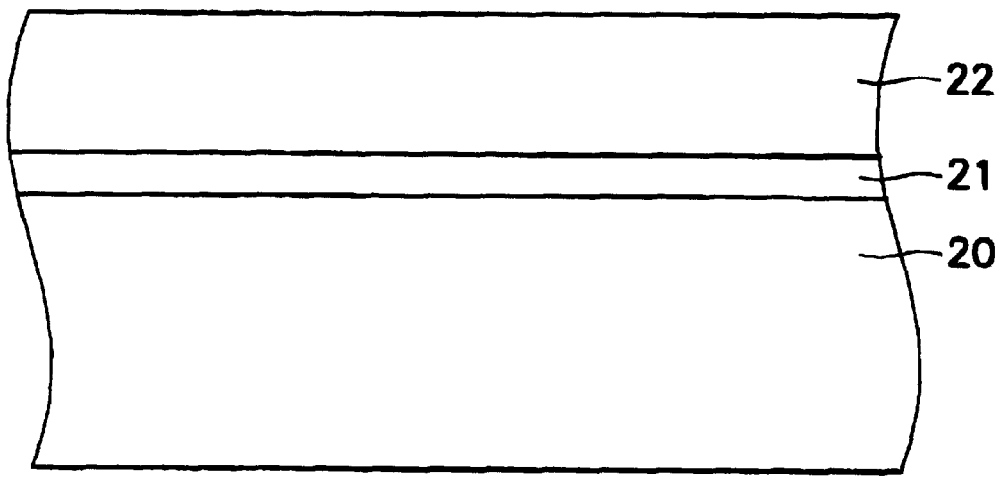
FIGS. 3A–3J are cross-sectional views, illustrating the process flow of forming the field oxide according to a preferred embodiment of the present invention.

Referring to FIG. 3A, a first pad layer 21 and a first mask layer 22 are successively formed on a semiconductor substrate 20. The semiconductor substrate 20 can be made of silicon of germanium by means of an expitaxial or silicon on insulator method. P-type silicon substrate is taken as an example for better explanation. The first pad layer 21 can be a pad oxide layer, such as silicon oxide layer having a thickness of 100 Å to 300 Å formed by means of thermal oxidation or chemical vapor deposition (CVD). The first mask layer 22 can be a silicon nitride layer having a thickness of 1500 Å to 2500 Å formed by means of the low pressure chemical vapor deposition (LPCVD) process using $SiH_2Cl_2$ and $NH_3$ as reactants.

Figure 3B:
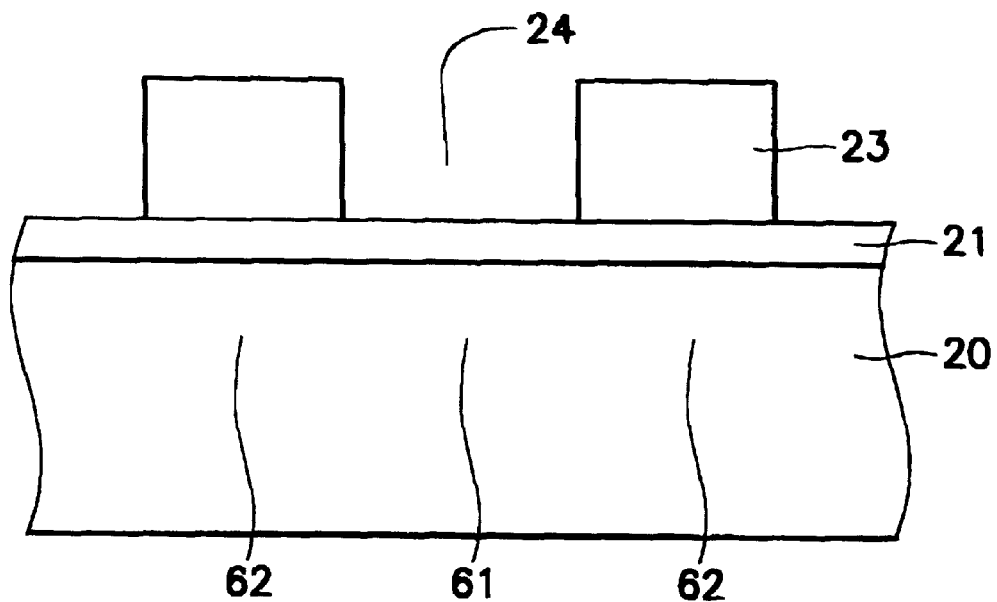

Subsequently, referring to FIG. 3B, the first mask layer 22 is patterned by photolithography. For example, the first mask layer 22 is anisotropically etched by reactive ion etching (RIE) using a resist as a mask so as to form a patterned mask layer 23 and an opening 24. The region defined by the opening 24 is that for forming a field oxide layer in the future, which is called an isolation region 61. The region defined by the patterned mask layer 23 is that for forming a semiconductor device in the future, which is called an active region 62.

Figure 3C:
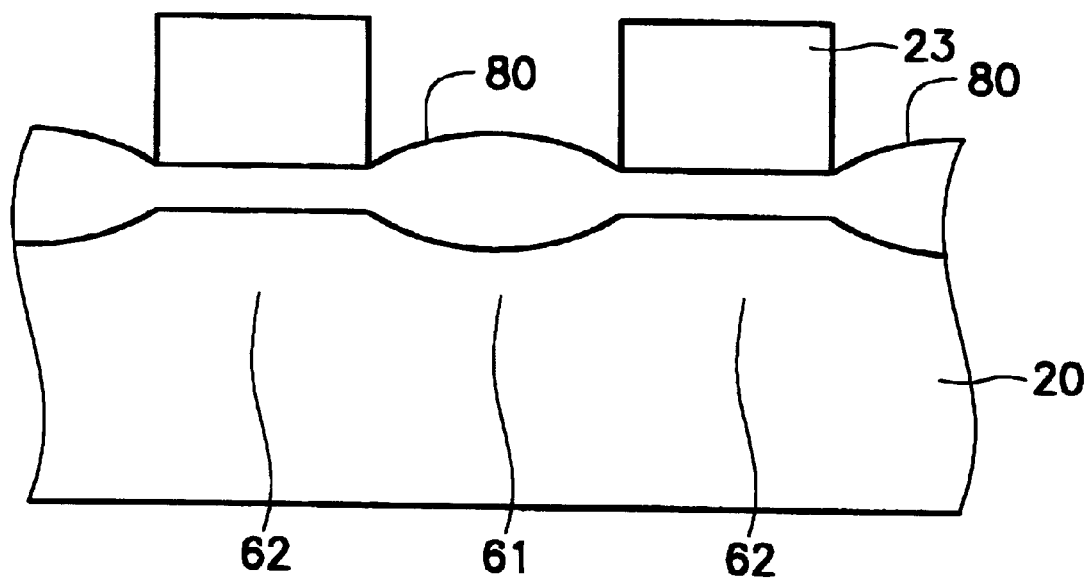

Subsequently, referring to FIG. 3C, thermal oxidation is conducted to form a first field oxide layer 80 on the isolation region 61, which is thinner than a conventional field oxide layer. For example, the semiconductor substrate 20 is placed in a furnace at a temperature of 800° C. to 1150° C. and the oxygen gas is introduced for oxidation. Thus, the first field oxide layer 80 having a thickness of about 500 Å to 1000 Å is formed on the isolation region 61 of the semiconductor substrate.

Figure 3D:
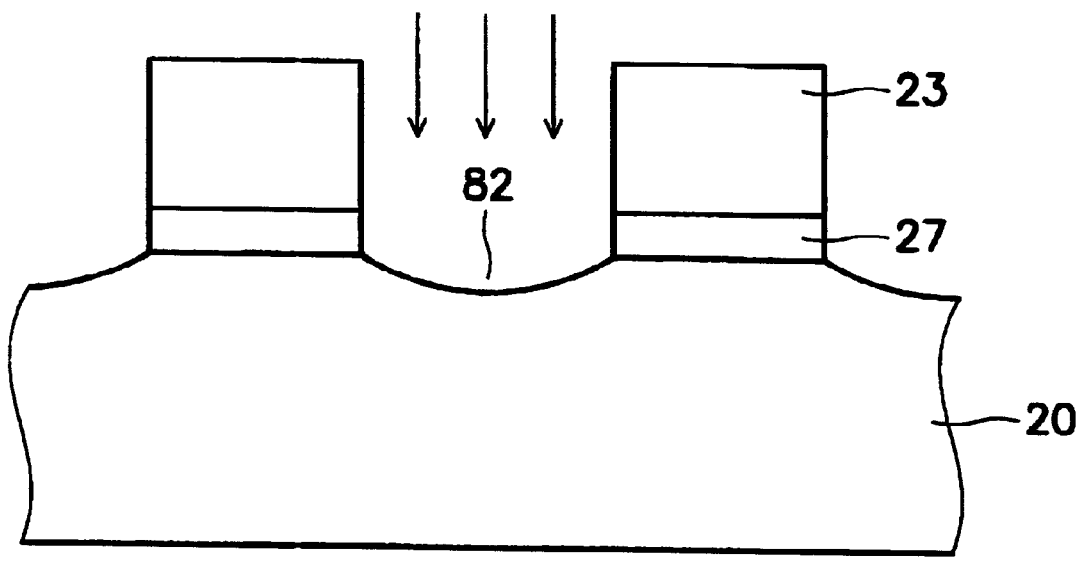

Subsequently, referring to FIG. 3D, the first field oxide layer 80 is removed to form a concave portion 82, leaving a residual portion 27 of the first pad layer. For example, the first field oxide layer 80 can be etched by means of anisotropical RIE using $C_4H_8$ as the main ethcing reactive gas. The etching selectivity of $SiO_2$ to Si is preferably from 20 to 40.

Figure 3E:
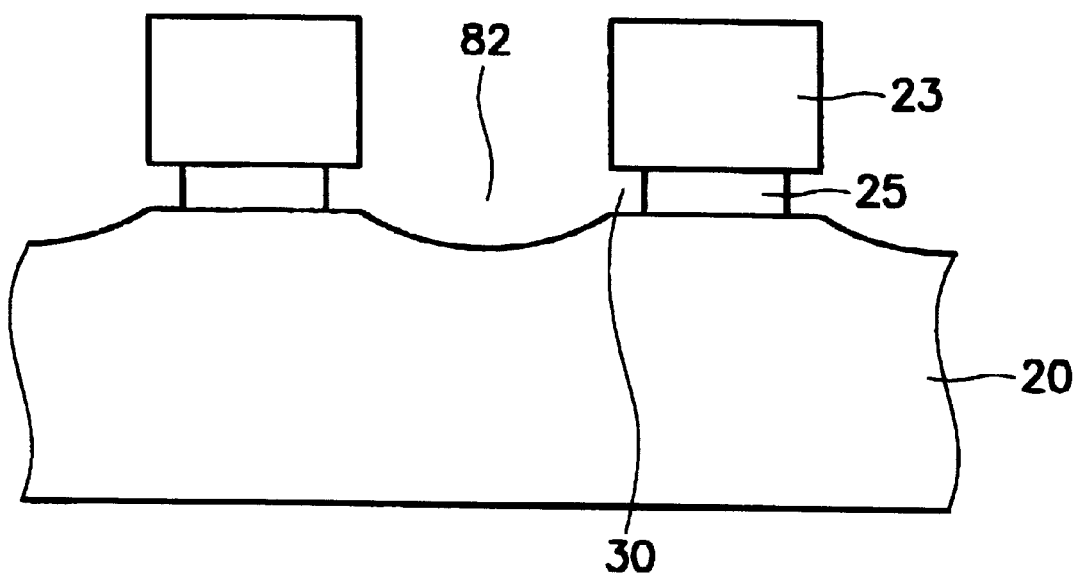

Subsequently, referring to FIG. 3E, the area of the residual first pad layer 27 which is exposed by the concave portion 82 is etched so as to form a cavity 30 beneath the patterned first mask layer 23. The first pad layer after etching is referred to by the numeral 25. The etching can be wet etching conducted by a hydrofluoric acid solution.

Figure 3F:
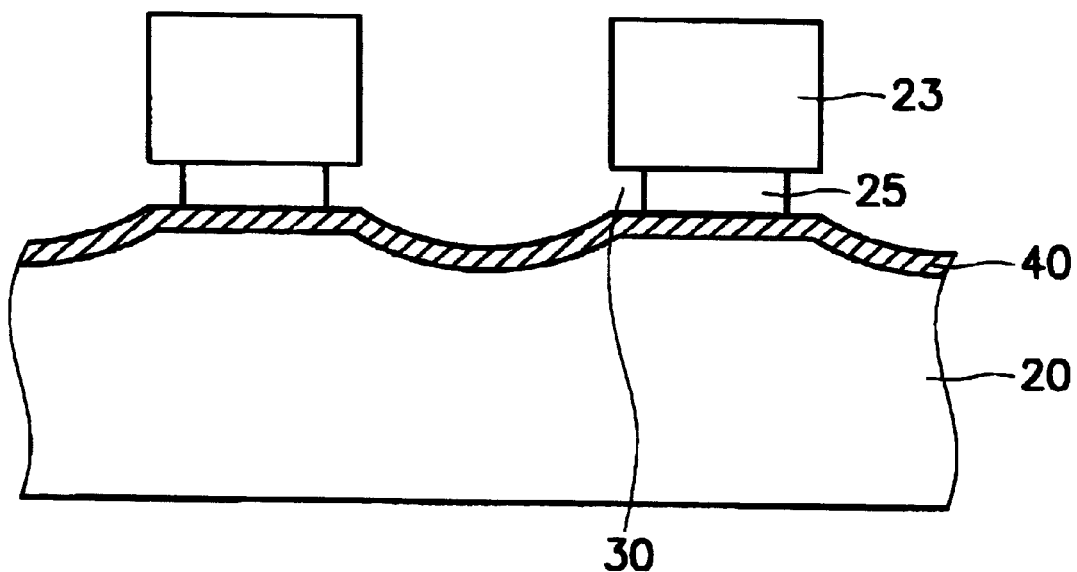
Figure 3G:
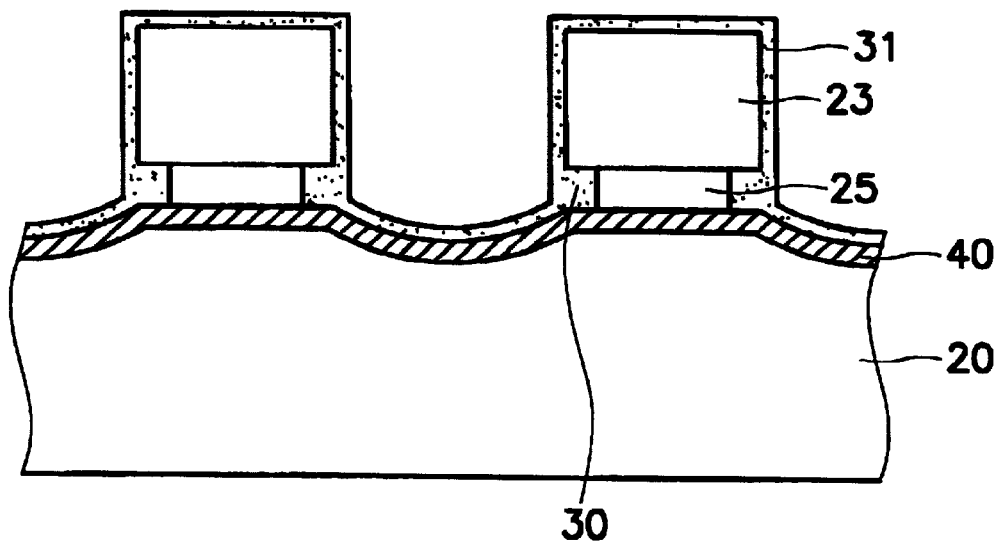
Figure 3H:
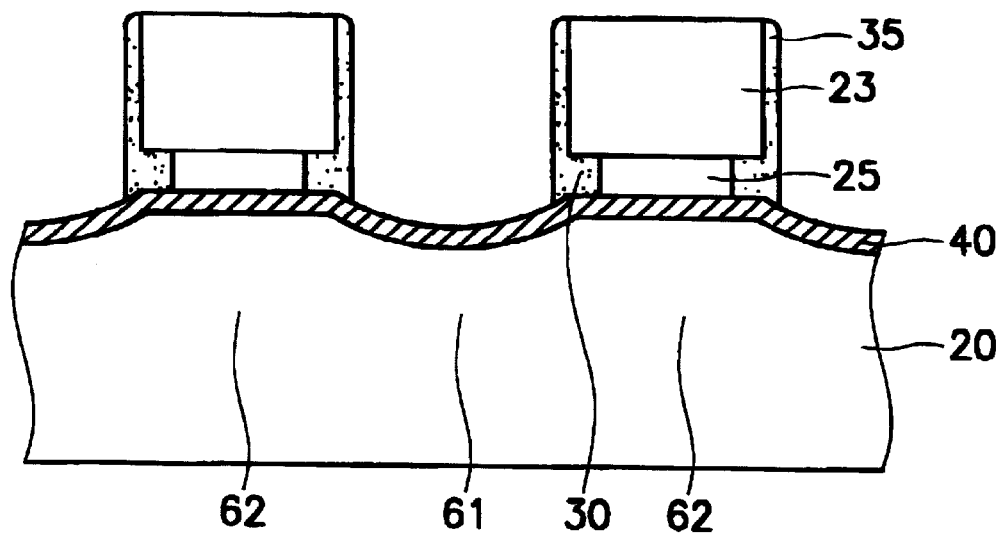

Subsequently, referring to FIG. 3F, a second pad layer 40 is formed on the semiconductor substrate 20. The second pad layer 40 has a thickness smaller than the first pad layer 25; for example, it can be a silicon oxide layer having a thickness of 60 Å to 120 Å formed by thermal oxidation. Subsequently, the step of forming a mask portion in the sidewall of the patterned first mask layer 23 and the cavity 30 is performed. Referring to FIGS. 3G and 3H, for example, a second mask layer 31 is conformably formed on the second pad layer 40 and the first mask layer 23 so as to fill the mask material into the cavity 30. Then, the second mask layer 31 is anisotropically etched until the second pad layer 40 in the isolation region 61 is exposed. Therefore, the second mask layer 31 only remains on the side walls of the first mask layer 23 and in the cavity 30. The remaining mask portion is referred to a liner 35. The second mask layer 31 can be a silicon nitride layer which is, for example, formed by means of LPCVD using $SiH_2Cl_2$ and $NH_3$ as reactants. The thickness of the second mask layer 31 is made as small as possible, and the only requirement is that the recess 30 be fully filled with silicon nitride. Therefore, the thickness of the second mask (silicon nitride) layer 31 is less than 300 Å, which is far smaller than the thickness of a conventional nitride side wall. The silicon nitride layer 31 can be etched by means of anisotropical RIE using using plasma of a fluorine-containing gas as the main etching reactive gas. Suitable fluorine-containing gas can be nitrogen fluoride ($NF_3$), $SF_6$, and $CF_4$.

Figure 3I:
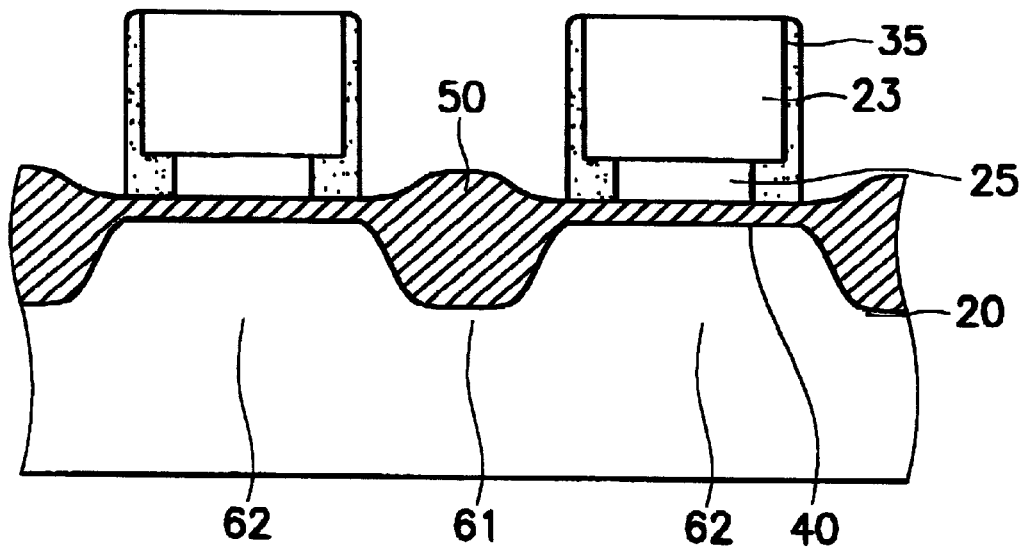

Subsequently, referring to FIG. 3I, thermal oxidation is conducted to form a second field oxide layer on the isolation region 61, which is thicker than the first field oxide layer 80. For example, the semiconductor substrate 20 is placed in a furnace at a temperature of 800° C. to 1150° C. and the oxygen gas is introduced for oxidation. Thus, a second field oxide layer 50 having a thickness of 3500 Å to 5000 Å is formed on the isolation region 61 of the semiconductor substrate. Since the second pad layer (silicon oxide layer) 40 is very thin, when the second field oxide layer grows, it is not easy for oxygen to diffuse horizontally along such a thin pad layer 40. Thus, in contrast to the conventional thicker pad layer, the bird's beak encroachment (BBE) in the active region can be greatly inhibited by means of the thinner pad layer of the present invention.

Generally speaking, the pad layer with inadequate thickness can not take the stress generated when the field oxide grows, thus generating defects in the silicon substrate structure. The present invention uses the thinner second pad layer 40 to inhibit BBE; however, the high stress generated by the mask layer 23 can be solved by the thicker first pad layer 25 at the same time. Therefore, the stress can be effectively alleviated and the defects of the silicon substrate can be prevented.

In the conventional process for solving BBE by means of silicon nitride side wall spacers, since the silicon nitride spacer has occupied a portion of width, the field oxide layer can only grow in a limited portion of the opening. This worsens the thinning effect of the field oxide layer, and can not meet the requirement for the present small design rule. In contrast, the silicon nitride liner used in the present invention has a much smaller width than the conventional silicon nitride side wall spacer; therefore, the field oxide layer can be grown in a larger area of the opening. Thus, the thinning effect can be alleviated, and the field oxide layer with an adequate thickness can be grown at a smaller design rule, achieving a good isolation effect.

In addition, a smooth concave portion is formed on the silicon substrate by means of forming a thin field oxide layer in the isolation region and then etching the thin field oxide layer. Due to smoothness of the concave portion, when the thick field oxide layer is formed in the concave portion, stress accumulation does not easily occur. Thus, defects in the silicon substrate caused from stress accumulation can be prevented.

Figure 3J:
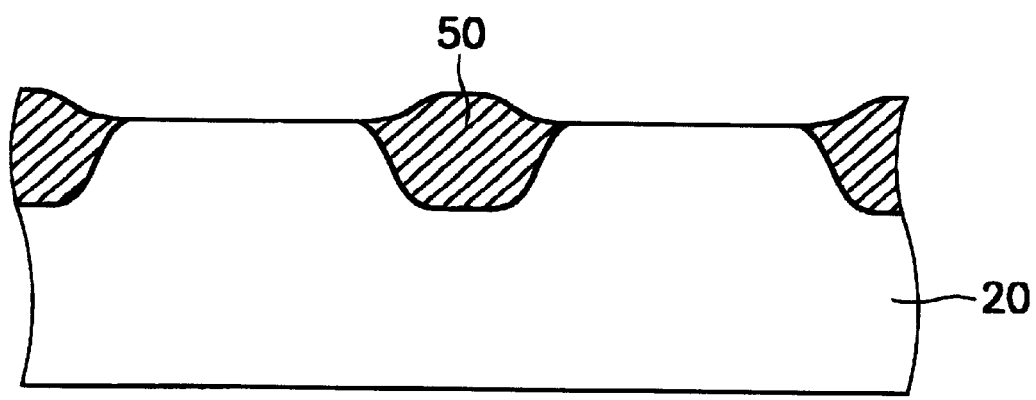

Finally, referring to FIG. 3J, the liner 35, the first mask layer 23, the first pad layer 25, and the second pad layer 40 are removed. For example, the liner 35 and the first mask layer 23 can be removed by a heated phosphoric acid solution, and the first pad layer 25 and the second pad layer 40 can be removed by a diluted hydrofluoric acid solution. A structure as shown in FIG. 3J is thus obtained.

In conclusion, according to the present invention, the field oxide layer is grown by means of the local pad film thinning technique and forming a nitride liner. Thus, the bird's beak encroachment and the thinning effect of the field oxide layer can both be inhibited. In addition, defects in the silicon substrate due to the formation of the field oxide can also be inhibited. The field oxide thus grown has an adequate thickness and a good isolation effect.

The foregoing description of the preferred embodiments of this invention has been presented for purposes of illustration and description. Obvious modifications or variations are possible in light of the above teaching. The embodiments were chosen and described to provide the best illustration of the principles of this invention and its practical application to thereby enable those skilled in the art to utilize the invention in various embodiments and with various modification as are suited to the particular use contemplated. All such modifications and variations are within the scope of the present invention as determined by the appended claims when interpreted in accordance with the breadth to which they are fairly, legally, and equitably entitled.

What is claimed is:

1. A method for fabricating a field oxide on a semiconductor substrate, comprising the steps of:
   (a) forming successively a first pad layer and a first mask layer;
   (b) forming an opening in the first mask layer to define a region for forming the field oxide;
   (c) forming a first field oxide in the opening;
   (d) removing the first field oxide to form a concave portion;
   (e) removing the first pad layer exposed by the concave portion to form a cavity;
   (f) forming a second pad layer having a smaller thickness than the first pad layer on the semiconductor substrate;
   (g) forming a mask portion in the sidewall of the patterned first mask layer and the cavity, wherein the mask portion in the sidewall of the patterned first mask layer has a thickness less than 300 Å; and
   (h) carrying out thermal oxidation to form a second field oxide in the concave portion.

2. The method as claimed in claim 1, wherein the first pad layer is an oxide layer.

3. The method as claimed in claim 1, wherein the first mask layer is a nitride layer.

4. The method as claimed in claim 1, wherein the mask portion is composed of a nitride.

5. The method as claimed in claim 1, wherein the step (e) is conducted by wet etching.

6. The method as claimed in claim 1, wherein the step (f) is conducted by thermal oxidation.

7. The method as claimed in claim 1, wherein the first pad layer has a thickness of 100 Å to 300 Å, and the second pad layer has a thickness of 60 Å to 120 Å.

8. The method as claimed in claim 1, wherein the step (g) comprises:

forming conformably a second mask layer on the second pad layer and the first mask layer to fill the mask portion into the cavity; and
   anisotropically etching the second mask layer.

9. The method as claimed in claim 1, further comprising, after step (h), a step of removing the first mask layer, the mask portion, the first pad layer, and the second pad layer.

10. The method as claimed in claim 1, wherein the first field oxide has a smaller thickness than the second field oxide.

11. The method as claimed in claim 10, wherein the first field oxide has a thickness of 500 Å to 1000 Å.

12. A method for fabricating a field oxide on a semiconductor substrate, comprising the steps of:
   (a) forming successively a first pad layer and a first mask layer;
   (b) forming an opening in the first mask layer to define a region for forming the field oxide;
   (c) forming a first field oxide in the opening;
   (d) removing the first field oxide to form a concave portion;
   (e) wet etching the first pad layer exposed by the concave portion to form a cavity;
   (f) carrying out thermal oxidation to form a second pad layer having a smaller thickness than the first pad layer on the semiconductor substrate;
   (g) forming conformably a second mask layer on the second pad layer and the first mask layer to fill the mask portion into the cavity, wherein the second mask layer has a thickness less than 300 Å;
   (h) anisotropically etching the second mask layer; and
   (i) carrying out thermal oxidation to form a second field oxide in the concave portion.

13. The method as claimed in claim 12, wherein the first pad layer is an oxide layer.

14. The method as claimed in claim 12, wherein the first mask layer is a nitride layer.

15. The method as claimed in claim 12, wherein the mask portion is composed of a nitride.

16. The method as claimed in claim 12, wherein the first pad layer has a thickness of 100 Å to 300 Å, and the second pad layer has a thickness of 60 Å to 120 Å.

17. The method as claimed in claim 12, further comprising, after step (i), a step of removing the first mask layer, the mask portion, the first pad layer, and the second pad layer.

* * * * *